United States Patent
Adrian et al.

(10) Patent No.: US 9,066,444 B2
(45) Date of Patent: Jun. 23, 2015

(54) POWER SUPPLY UNIT WITH ARTICULATING FAN ASSEMBLY

(71) Applicants: Jason D. Adrian, Cedar Park, TX (US); Kevin W. Mundt, Austin, TX (US)

(72) Inventors: Jason D. Adrian, Cedar Park, TX (US); Kevin W. Mundt, Austin, TX (US)

(73) Assignee: Dell Products, LP, Round Rock, TX (US)

( * ) Notice: Subject to any disclaimer, the term of this patent is extended or adjusted under 35 U.S.C. 154(b) by 170 days.

(21) Appl. No.: 13/665,273

(22) Filed: Oct. 31, 2012

(65) Prior Publication Data

US 2014/0118937 A1    May 1, 2014

(51) Int. Cl.
*H05K 7/20* (2006.01)

(52) U.S. Cl.
CPC ........ *H05K 7/20172* (2013.01); *H05K 7/20736* (2013.01); *H05K 7/20909* (2013.01)

(58) Field of Classification Search
USPC ........................ 361/676–678, 679.46–679.54, 361/688–722, 752–756, 831
See application file for complete search history.

(56) References Cited

U.S. PATENT DOCUMENTS

| | | | | |
|---|---|---|---|---|
| 6,040,981 | A * | 3/2000 | Schmitt et al. | 361/695 |
| 8,295,041 | B2 * | 10/2012 | Cheng et al. | 361/679.48 |
| 2004/0160741 | A1 | 8/2004 | Moss et al. | |
| 2008/0278905 | A1 | 11/2008 | Artman et al. | |
| 2009/0059513 | A1 | 3/2009 | Hood, III et al. | |
| 2009/0154092 | A1 * | 6/2009 | Chen | 361/679.51 |
| 2009/0265045 | A1 | 10/2009 | Coxe, III | |
| 2010/0097019 | A1 | 4/2010 | Artman et al. | |
| 2011/0012547 | A1 | 1/2011 | Sultenfuss et al. | |
| 2011/0122573 | A1 * | 5/2011 | Peng et al. | 361/679.48 |
| 2011/0239025 | A1 | 9/2011 | Artman et al. | |

* cited by examiner

*Primary Examiner* — Courtney Smith
(74) *Attorney, Agent, or Firm* — Larson Newman, LLP

(57) ABSTRACT

A fan assembly is flexibly attached to an electronic device enclosure. The fan assembly is configured to pivot with respect to the electronic device enclosure from a horizontal position to an angled position during insertion of the enclosure into the chassis. The horizontal position is to facilitate insertion of the electronic device enclosure into a chassis. The angled position is maintained when the electronic device enclosure is fully inserted into the chassis.

20 Claims, 3 Drawing Sheets

POWER SUPPLY UNIT WITH ARTICULATING FAN ASSEMBLY

FIELD OF THE DISCLOSURE

This disclosure generally relates to information handling systems, and more particularly relates to techniques for providing cooling of information handling systems.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, networking systems, and data storage systems.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

Figure 1:
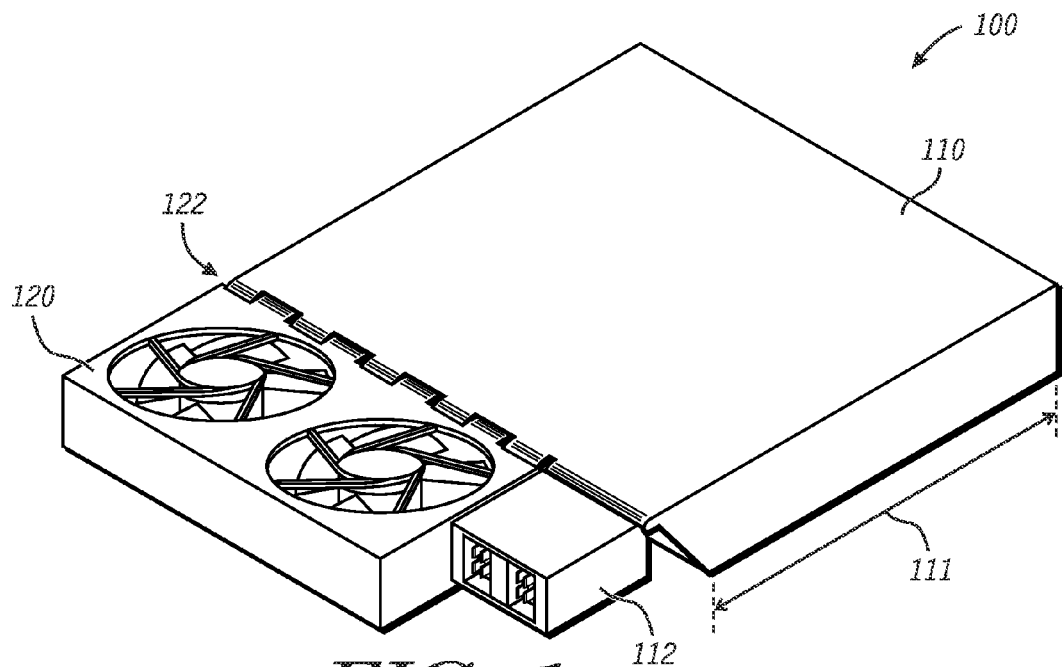
FIG. 1 is a perspective view illustrating a power supply and fan assembly according to a specific embodiment of the present disclosure.

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings may be utilized in this application, as well as in other applications and with several different types of architectures such as distributed computing architectures, client or server architectures, or middleware server architectures and associated components.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router, wireless router, or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

An enclosure housing an information handling system, such as a server, may comply with industry standards to facilitate installation of the system into a chassis, such as a server rack. A server rack is generally designed to house multiple servers, and may accommodate other server-related equipment such as power supplies, data storage devices, communication networking equipment, and the like. For example, a data center may utilize one or more server racks to house servers and network equipment, and may utilize additional server racks to house data storage devices including hard disk drives, storage controller devices, and the like. Server racks typically are designed to provide accessibility to equipment mounted therein and to facilitate installation and maintenance of the equipment. Mechanical standards have emerged such as the International Electrotechnical Commission (IEC) standards that enumerate dimensional specifications of the servers, server racks, and associated mechanical components. By conforming to these standards, a manufacturer of servers and server related equipment is assured that their products can be readily incorporated into compliant rack systems. A server rack typically provides rails, shelves, guides, or other mechanical features that allow a collection of individual servers to be installed in a vertical stack configuration. The IEC standard provides a unit dimension referred to as a rack unit, or simply "u." For example, a server can be configured to occupy a single rack unit of vertical space. Alternatively, a server or server-related device can occupy two, three, or a greater number of rack units of vertical height. By conforming to these standard dimensions, the equipment can be mounted within the server rack using standardized mounting hardware.

A modern business or enterprise may utilize a large number of information handling systems. To minimize building space required to accommodate these systems, server racks are designed to accommodate a large number of servers and related equipment, and to pack the equipment as densely as possible. Equipment housed in a server rack may produce considerable heat during operation. Accordingly, the capacity of fans and other cooling systems to dissipate the heat may limit the density of the components that can be installed within a server. Cooling solutions can be further constrained by other design and usage criteria. For example, it is common practice in a data storage system to place a large number of disk drives such that they are readily accessible from the front of a rack enclosure. Accordingly, data storage controllers and power supplies generally are installed in the rear of the enclosure. Furthermore, it is a common requirement that each piece of equipment installed in a server rack, including cooling fans, be individually accessible and serviceable without powering down other equipment included in the rack. In addition, cooling fans are preferably situated so that cool air is provided to devices installed in the front and to devices installed in the rear of the enclosure. Disclosed herein are techniques for incorporating cooling fans at a server rack or at a similar chassis. The techniques are illustrated below in association with a power supply device; however the techniques are readily adaptable for use with other equipment such as servers, controllers, and the like.

Figure 2:
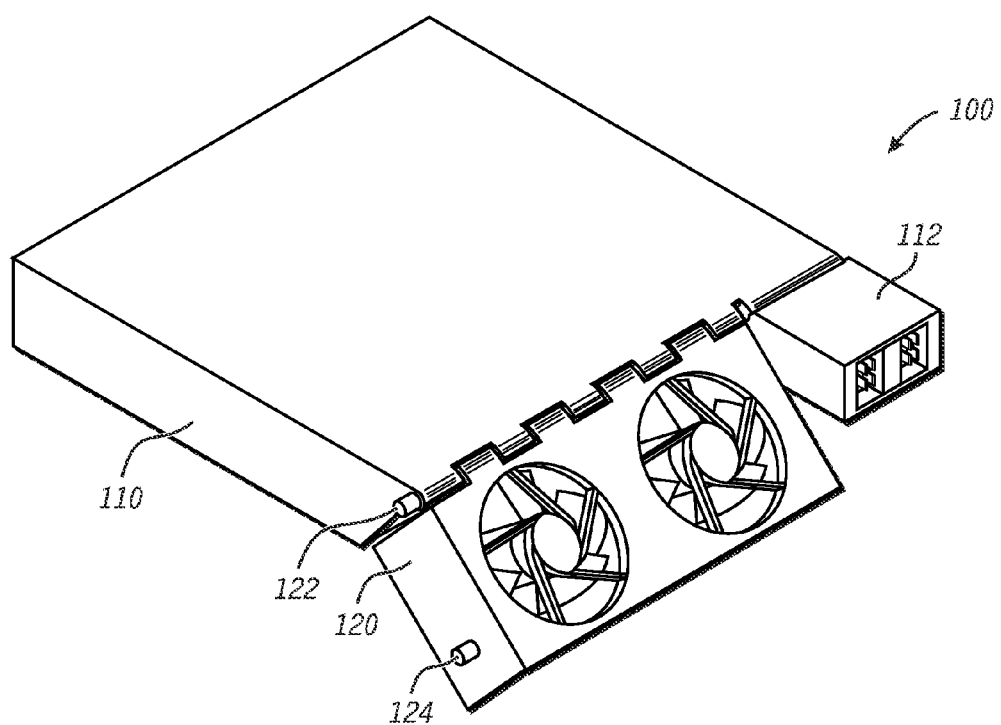
FIG. 2 is another perspective view of the power supply and fan assembly according to a specific embodiment of the present disclosure.

FIG. 1 shows a power supply and fan assembly 100 according to a specific embodiment of the present disclosure. The assembly 100 includes a power supply 110 and an attached fan 120. The fan 120 is configured to pivot with respect to the power supply 110, as illustrated at FIG. 2. In particular, the fan 120 is configured to pivot from the position shown at FIG. 1 to the position shown at FIG. 2 during the insertion of the power supply and fan assembly 100 into an enclosure, such as a server rack. The insertion operation can be better understood with reference to FIGS. 3 and 4. In an embodiment the assembly 100 is configured to slide into a server rack 300 or another type of enclosure, supported by fixed guides provided by the rack, such as the guides 302 shown at FIG. 3. Alternatively, the assembly 100 can be adapted to mount within a server rack by means of translating rails. The fan 120 can be flexibly attached to the power supply 110 using a hinge, such as the hinge 122 of FIG. 1, a flexible polymer, or the like. Prior to insertion into a server rack, chassis or similar enclosure, the fan 120 can be maintained in the flat position illustrated at FIG. 1. In the flat position, the fan 120 is parallel with a depth dimension 111 of the power supply 110. For example, a latch mechanism (shown at FIG. 6) can be employed to prevent the fan 120 from rotating relative to the power supply 110 until the assembly 100 is inserted into a chassis. In an embodiment, insertion of the assembly 100 into a cavity at the server rack releases the latch so that the fan 120 can rotate to the angled position shown at FIG. 2. In an embodiment, the fan is configured to pivot to an angle of approximately forty-five degrees with respect to the power supply; however a lesser or greater degree of articulation can be provided without departing from the scope of the present disclosure.

Figure 3:
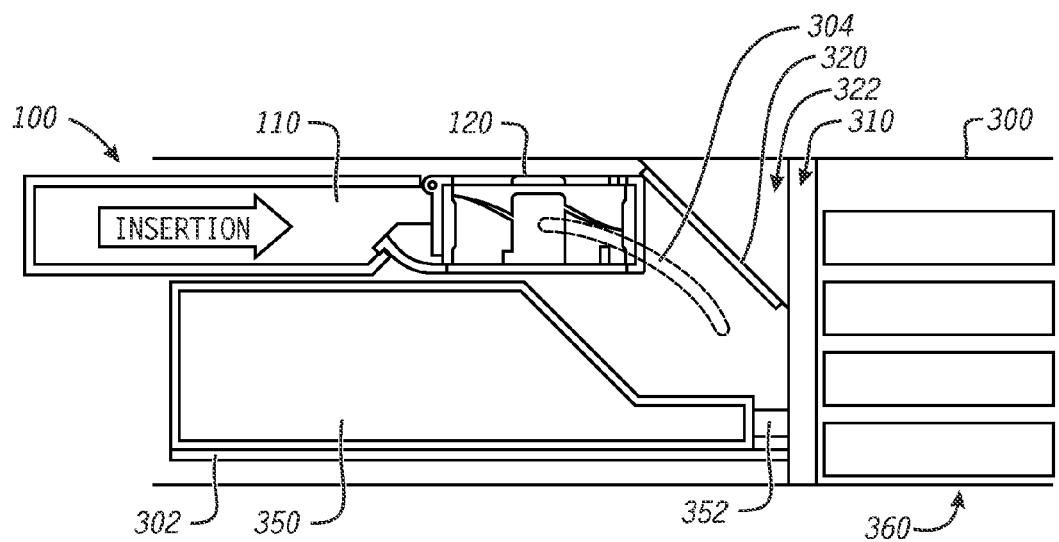
FIG. 3 is a side view illustrating insertion of the power supply and fan assembly of FIG. 1 into a chassis according to a specific embodiment of the present disclosure.
Figure 4:
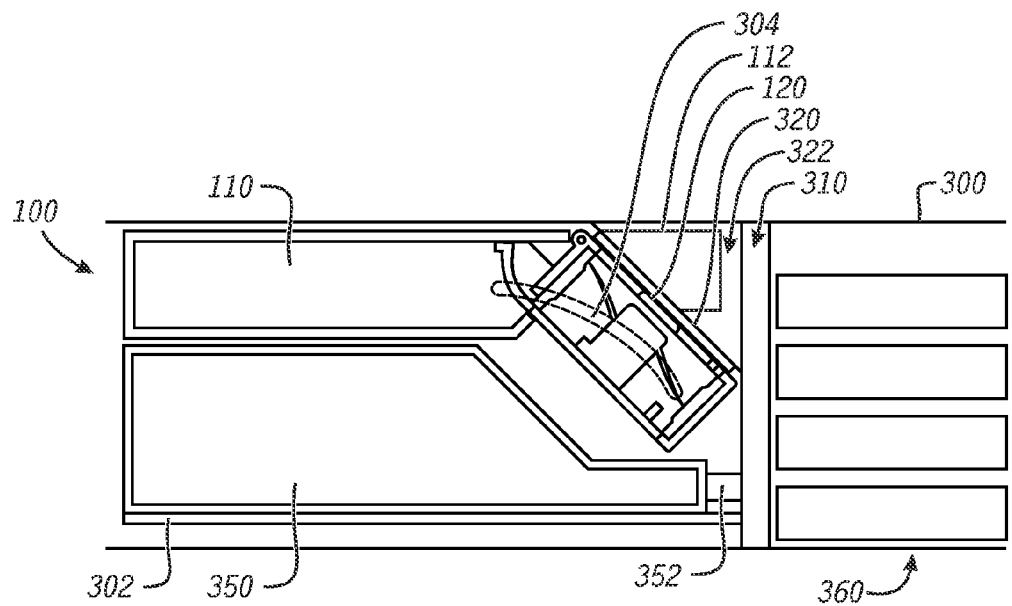
FIG. 4 is a side view illustrating the power supply and fan assembly fully inserted in the chassis according to a specific embodiment of the present disclosure.

FIGS. 3 and 4 show how the fan assembly pivots from the flat position of FIG. 1 to the angled position of FIG. 2 as the power supply and fan assembly 100 is inserted into a chassis 300. In an embodiment, the fan 120 can engage with a feature included at the chassis 300 that causes the fan 120 to pivot from the flat position of FIG. 1 to the angled position shown at FIG. 2. For example, the fan assembly can include a feature such as the pin 124 of FIG. 2 that is configured to engage with a corresponding guide located within the chassis cavity, such as track 304 of FIG. 3. During insertion of the assembly 100 into the cavity, the pin 124 at the fan 120 can engage with the track 304, causing the fan 120 to pivot to the angled position of FIG. 2, similar to how an overhead garage door articulates from one orientation to another orientation as the garage door travels along a track. In another embodiment, the power supply and fan assembly 100 can engage with linkages included within the chassis that cause the fan assembly 120 to rotate about the hinge 122 as the assembly 100 is inserted into the chassis.

The power supply 110 can include a power and communication connector 112 rigidly fixed to the power supply 110. The connector 112 is configured to engage with a corresponding connector/receptacle at a bulkhead 310 provided at the interior of the chassis 300. In an embodiment, the bulkhead 310 can be located approximately mid-plane within the server rack and can include electrical connectors configured to engage with corresponding connectors included on each device when the device is fully inserted into the chassis 300. For example, the bulkhead 310 can include electrical receptacles to interface with power supplies, controllers, and other devices installed from one side of chassis 300, and additional receptacles to interface with devices, such as hard disk drives 360 installed from the other side of the chassis 300. Wiring within the bulkhead 310 can communicate power and data signals between the devices, such as between devices installed at the front of the rack enclosure and devices installed at the rear of the enclosure. Sliding rails and corresponding cable management arms may therefore be unnecessary. Instead, devices are simply plugged into the bulkhead by inserting the devices at a desired location from the front or from the rear of the enclosure. An air space 322 adjacent to the bulkhead 310 can serve as an air plenum. During operation, the fan 120 can circulate cool air from the plenum through the power supply 110 to cool the power supply and other devices installed at the chassis 300.

Referring again to FIGS. 3 and 4, the power supply 110 can be installed immediately above another electronic device enclosure at the chassis 300, such as the storage controller canister 350. In an embodiment, the storage controller 350 is configured to control operation of one or more hard disk drives 360. The controller 350 includes a connector 352 that is configured to engage with a corresponding connector at the bulkhead 310 when the controller 350 is fully inserted into the enclosure. A modern data storage system can provide compute-intensive features such as data de-duplication, redundant array of independent disks (RAID) services, and the like. Accordingly, the controller included at the canister 350 can include one or more central processing units (CPUs) and can implement sophisticated file system protocols. Therefore, the controller can generate considerable heat and require substantial cooling. In an embodiment, the fan 120 is configured to provide cooling for the power supply 110 and for the controller canister 350. One skilled in the art will appreciate that the fan 120 can be flexibly attached to another device in the manner disclosed herein so that the fan pivots as shown at FIGS. 1-4 when the device is inserted into a chassis. For example, the fan 120 can be flexibly attached to a server, a network controller, another type of controller device, and the like. In an embodiment, the rear portion of the enclosure housing the controller 350, herein referred to as a canister, can be tapered as shown at FIG. 3 to accommodate the articulation of the fan 120 when the power supply and fan assembly 100 is fully inserted within the chassis 300. In another embodiment, the rear portion of the enclosure housing the power supply 110 can be tapered as shown at FIG. 1 to permit the fan 120 to articulate to the angled position when the power supply and fan assembly 100 is fully inserted within the chassis 300.

Figure 5:
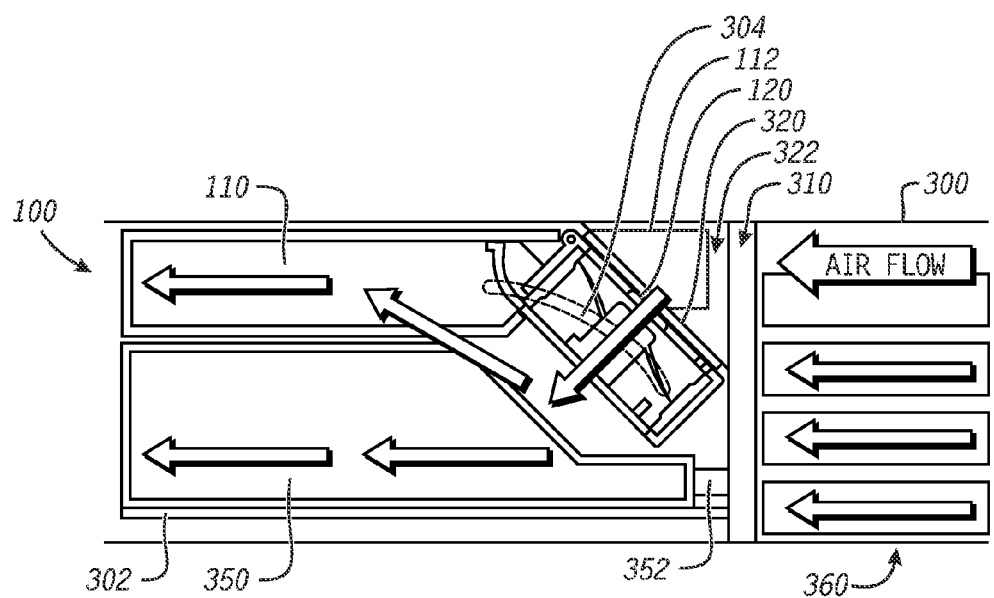
FIG. 5 is a side view illustrating air flow provided during operation of the fan assembly according to a specific embodiment of the present disclosure.

In an embodiment, the power supply 110 and the controller 350 can be housed in metal enclosures. The enclosure can include a large number of perforations to facilitate air flow provided by the fan 120 through each canister and from one canister to another. End plates of each canister can include similar perforations or mesh to permit entry and exit of air circulated by the fan 120. In an embodiment, a gasket 320 is configured to make contact with the fan 120 when the power supply and fan assembly 100 is fully inserted into the chassis. The gasket 320 can be installed at the chassis 300 or can be affixed to a canister, such as to the controller canister 350. The gasket is configured to seal the fan 120 against the plenum, channel the flow of air provided by the fan 120 into the devices installed at the enclosure, and to minimize the conduction of vibrations from the fan 120 to the devices installed at the chassis 300. FIG. 5 shows the flow of air provided during operation of the fan 120. For example, the fan 120 can draw cool air from outside the chassis 300 and direct the air flow through the perforated enclosures of the power supply 110 and the controller canister 350. In particular, cool air can be drawn from the front of the chassis (right side of FIG. 5), past the hard drives 360, and into the plenum 322. The gasket 320 is configured to seal the fan 120 to the plenum so that air flow provided by the fan 120 is forced to the front of the chassis (left side of FIG. 5) by preventing air flow provided by the fan 120 from exiting back into the plenum.

Figure 6:
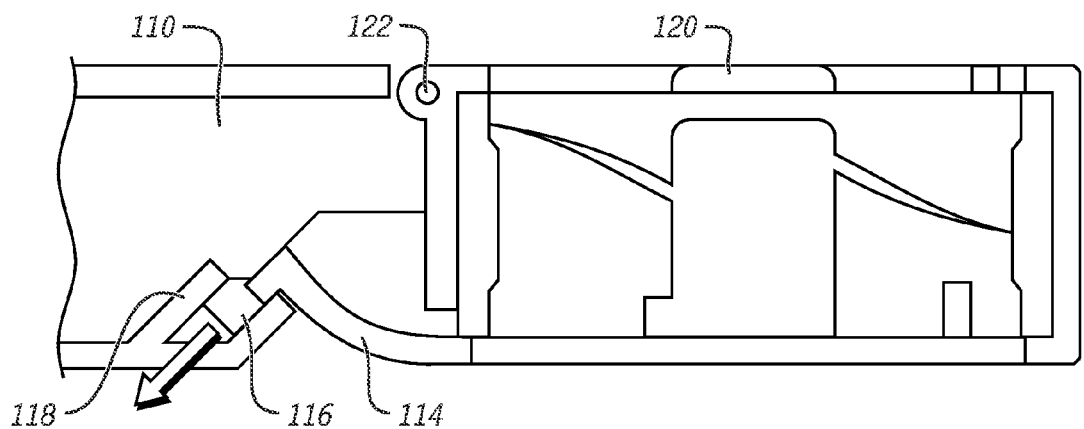
FIG. 6 is a side view of the power supply and fan assembly illustrating a latch mechanism according to a specific embodiment of the present disclosure.

FIG. 6 shows a latch mechanism for maintaining the fan assembly 120 in a flat position prior to insertion into the chassis 300 according to a specific embodiment of the present disclosure. The latch mechanism includes a plunger 116 that is configured to slide within a channel 118. The plunger 116 can be held in the position shown at FIG. 6 by a spring (not shown at FIG. 6) prior to the installation of the power supply and fan assembly into the chassis 300. While in this position, the plunger engages with a portion 114 of the fan assembly 120 to prevent the fan assembly 120 from pivoting about the hinge 122. In an embodiment, the plunger 116 is configured to engage with a feature included at the chassis 300 during insertion into the chassis so that the plunger is retracted from engagement with the portion 114, thus allowing the fan assembly to pivot about the hinge 122. One skilled in the art will appreciate that other latches and mechanisms can be used to prevent the fan assembly 120 from rotating with respect to the power supply 110 prior to insertion into the chassis 300, and to free the fan to pivot during insertion into the chassis.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A system comprising:
 a chassis;
 an electronic device enclosure to mount within the chassis; and
 a fan assembly flexibly attached to the electronic device enclosure, the fan assembly to pivot with respect to the electronic device enclosure from a first position to a second position in response to inserting the electronic device enclosure into the chassis, the first position to facilitate insertion of the electronic device enclosure into the chassis, the second position maintained when the electronic device enclosure is fully inserted into the chassis;
 wherein the fan assembly includes a guide feature that engages with a corresponding feature of the chassis, the guide feature to translate the fan assembly from the first position to the second position during insertion of the electronic device enclosure into the chassis; and
 wherein a rotational plane of a fan blade of the fan assembly is parallel to a depth dimension of the electronic device enclosure in the first position and is not parallel to the depth dimension of the electronic device enclosure in the second position.

2. The system of claim 1, wherein the fan assembly includes a latch to maintain the fan assembly at the first position prior to insertion of the electronic device enclosure into the chassis, and wherein insertion of the electronic device enclosure into the chassis releases the latch so that the fan can pivot to the second position.

3. The system of claim 1, wherein the electronic device enclosure is perforated to allow air to flow through the enclosure.

4. The system of claim 1, wherein the second position comprises an angle of between 10 degrees and 90 degrees with respect to the first position.

5. The system of claim 1, wherein the chassis includes a gasket affixed to the chassis to make contact with the fan assembly when the electronic device enclosure is fully inserted within the chassis.

6. The system of claim 1, further comprising a data processing device to mount within the chassis vertically adjacent to the electronic device enclosure, wherein the fan assembly is to provide air circulation to the electronic device enclosure and to the data processing device.

7. The system of claim 6, wherein the data processing device includes an attached gasket to make contact with an adjacent portion of the fan assembly when the electronic device enclosure is fully inserted within the chassis.

8. The system of claim 1, further comprising:
 a data storage device to mount within the chassis horizontally adjacent to the electronic device enclosure; and
 wherein the chassis is to receive for installation the electronic device enclosure and fan assembly from a first side of the chassis and to receive the data storage device for installation from a second side of the chassis, the second side opposite the first side, and wherein the fan assembly is located between the electronic device enclosure and the data storage device when the electronic device enclosure is fully inserted into the chassis.

9. The system of claim 1, wherein the fan assembly is flexibly attached to the electronic device enclosure using a hinge, and wherein the hinge includes material to dampen the propagation of vibration from the fan assembly to the electronic device enclosure.

10. A device comprising:
 an electronic device enclosure to mount within a chassis; and
 a fan assembly flexibly attached to the electronic device enclosure and to progressively pivot with respect to the electronic device enclosure from a first position to a second position in response to incremental insertion of the electronic device enclosure into the chassis, the first position to facilitate insertion of the electronic device enclosure into a chassis, the second position maintained when the electronic device enclosure is fully inserted into the chassis;

wherein the fan assembly includes a guide feature that engages with a corresponding feature of the chassis, the guide feature to translate the fan assembly from the first position to the second position during insertion of the electronic device enclosure into the chassis; and wherein a rotational plane of a fan blade of the fan assembly is parallel to a depth dimension of the electronic device enclosure in the first position and is not parallel to the depth dimension of the electronic device enclosure in the second position.

11. The device of claim 10, wherein the fan assembly includes a latch to maintain the fan assembly at the first position prior to insertion of the electronic device enclosure into the chassis, and wherein insertion of the electronic device enclosure into a cavity of the chassis releases the latch so that the fan can pivot to the second position.

12. The device of claim 10, wherein the second position comprises an angle of between 10 degrees and 90 degrees with respect to the first position.

13. A method comprising:

providing a power supply, the power supply to mount within a chassis, the power supply having a fan assembly flexibly attached to the power supply, the fan assembly to pivot with respect to the power supply from a first position to a second position in response to inserting the electronic device enclosure into the chassis, the first position to facilitate insertion of the power supply into the chassis, the second position maintained when the power supply is fully inserted into the chassis, wherein a rotational plane of a fan blade of the fan assembly is parallel to a depth dimension of the power supply in the first position and is not parallel to the depth dimension of the power supply in the second position, wherein the fan assembly includes a guide feature that engages with a corresponding feature of the chassis, the guide feature to translate the fan assembly from the first position to the second position during insertion of the power supply into the chassis.

14. The method of claim 13, wherein the fan assembly includes a latch to maintain the fan assembly at the first position prior to insertion of the power supply into the chassis, and wherein insertion of the power supply into a cavity of the chassis releases the latch so that the fan can pivot to the second position.

15. The method of claim 13, wherein the power supply includes an enclosure, the enclosure perforated to allow air to flow through the enclosure.

16. The method of claim 13, wherein the second position comprises an angle of between 10 degrees and 90 degrees with respect to the first position.

17. The method of claim 13, wherein the fan assembly is to make contact with a gasket when the power supply is fully inserted into the chassis, the gasket to reduce conduction of vibration from the fan assembly to the chassis.

18. The device of claim 10, wherein the chassis includes a gasket affixed to the chassis to make contact with the fan assembly when the electronic device enclosure is fully inserted within the chassis.

19. The method of claim 13, wherein the chassis includes a gasket affixed to the chassis to make contact with the fan assembly when the electronic device enclosure is fully inserted within the chassis.

20. The method of claim 13, wherein the fan assembly is flexibly attached to the electronic device enclosure using a hinge, and wherein the hinge includes material to dampen the propagation of vibration from the fan assembly to the electronic device enclosure.

* * * * *